United States Patent
Yamamoto et al.

(10) Patent No.: US 6,980,044 B2
(45) Date of Patent: Dec. 27, 2005

(54) POWER ELEMENT PROTECTION CIRCUIT AND SEMICONDUCTOR DEVICE INCORPORATING IT

(75) Inventors: Seiichi Yamamoto, Kyoto (JP); Norihiro Maeda, Kyoto (JP); Toyokazu Ueda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 3 days.

(21) Appl. No.: 10/848,568

(22) Filed: May 19, 2004

(65) Prior Publication Data

US 2004/0246043 A1    Dec. 9, 2004

(30) Foreign Application Priority Data

May 19, 2003    (JP) ............................. 2003-139831

(51) Int. Cl.[7] ........................................ H03K 17/687
(52) U.S. Cl. ...................... 327/427; 327/350; 361/91.1
(58) Field of Search ......................................... 327/427

(56) References Cited

U.S. PATENT DOCUMENTS 6,456,156 B1 *  9/2002  Frey et al. .................. 327/541

FOREIGN PATENT DOCUMENTS

| JP | 2606461 | 9/2000 |
| JP | 2001-203091 | 7/2001 |

* cited by examiner

Primary Examiner—Quan Tra
(74) Attorney, Agent, or Firm—Arent Fox PLLC

(57) ABSTRACT

Connected to a power element having a first electrode, a second electrode, and a control electrode, a power element protection circuit detects a voltage between the first and second electrodes of the power element and the current flowing through the power element, then logarithmically converts a current proportional to the detected voltage and a current proportional to the detected current individually, then adds the results together, then subtracts a predetermined value from the sum, then antilogarithmically converts the result with an antilogarithmic converter, and then limits the driving of the power element based on the output of the antilogarithmic converter.

18 Claims, 16 Drawing Sheets

US 6,980,044 B2

POWER ELEMENT PROTECTION CIRCUIT AND SEMICONDUCTOR DEVICE INCORPORATING IT

This application is based on Japanese Patent Application No. 2003-139831 filed on May 19, 2003, the contents of which are hereby incorporated by reference.

BACKGROUND OF THE INVENTION

1. Field of the Invention

The present invention relates to a power element protection circuit for preventing breakdown of a power element such as a power MOSFET or power bipolar transistor.

2. Description of the Prior Art

Conventionally, one type of power element protection circuit, which is commonly formed on a semiconductor integrated circuit chip, is a thermal shutdown circuit. A thermal shutdown circuit detects temperature with a temperature sensor incorporated therein, and, when the detected temperature is higher than a set temperature, stops the operation of a power element to protect it from thermal breakdown.

Another type of power element protection circuit, which is less commonly used, detects the current that flows through a power element and controls the power element in such a way that the detected current does not become higher than a set current.

A thermal shutdown circuit as described above can be realized with a simple circuit configuration. However, since a power device and a temperature sensor cannot be formed in the same place, when, in particular, transient heat is produced in the power element, there arises a great difference between the temperature detected by the temperature sensor and the temperature of the power element itself. This may cause the thermal shutdown circuit to fail to stop the operation of the power element in time, resulting in thermal breakdown of the power element.

On the other hand, in a power element protection circuit of the type that limits the current that flows through a power element, as the supply voltage becomes higher and thus the voltage drop across the power element becomes greater, the power dissipation in the power element may become so great as to cause thermal breakdown of the power element. An attempt to avoid this by making the set current smaller in case of a high supply voltage, however, may adversely affect the desired operation.

SUMMARY OF THE INVENTION

An object of the present invention is to provide a power element protection circuit that, despite having a simple circuit configuration, can prevent breakdown of a power element even in a case where transient heat is produced in the power element or where the supply voltage fluctuates, and to provide a semiconductor device incorporating such a power element protection circuit.

To achieve the above object, according to one aspect of the present invention, a power element protection circuit is provided with: a voltage detector that detects, with respect to a power element having a first electrode, a second electrode, and a control electrode, the voltage between the first and second electrodes of the power element and that then outputs a current proportional to the detected voltage; a current detector that detects the current flowing through the power element and that then outputs a current proportional to the detected current; a first logarithmic converter that logarithmically converts and then outputs the current outputted from the current detector; a second logarithmic converter that logarithmically converts and then outputs the current outputted from the voltage detector; an antilogarithmic converter that antilogarithmically converts a level derived from the sum of the outputs of the first and second logarithmic converters; and a driving limiter that limits the driving of the power element based on the output of the antilogarithmic converter.

According to another aspect of the present invention, a semiconductor device is provided with: a power element having a first electrode, a second electrode, and a control electrode; a driver that feeds a drive signal to the control electrode of the power element to drive the power element; and a power element protection circuit that is connected to the power element and to the driver so as to control the driver. Here, the power element protection circuit is provided with: a voltage detector that detects the voltage between the first and second electrodes of the power element and that then outputs a current proportional to the detected voltage; a current detector that detects the current flowing through the power element and that then outputs a current proportional to the detected current; a first logarithmic converter that logarithmically converts and then outputs the current outputted from the current detector; a second logarithmic converter that logarithmically converts and then outputs the current outputted from the voltage detector; an antilogarithmic converter that antilogarithmically converts a level derived from the sum of the outputs of the first and second logarithmic converters; and a driving limiter that limits the driving of the power element based on the output of the antilogarithmic converter.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
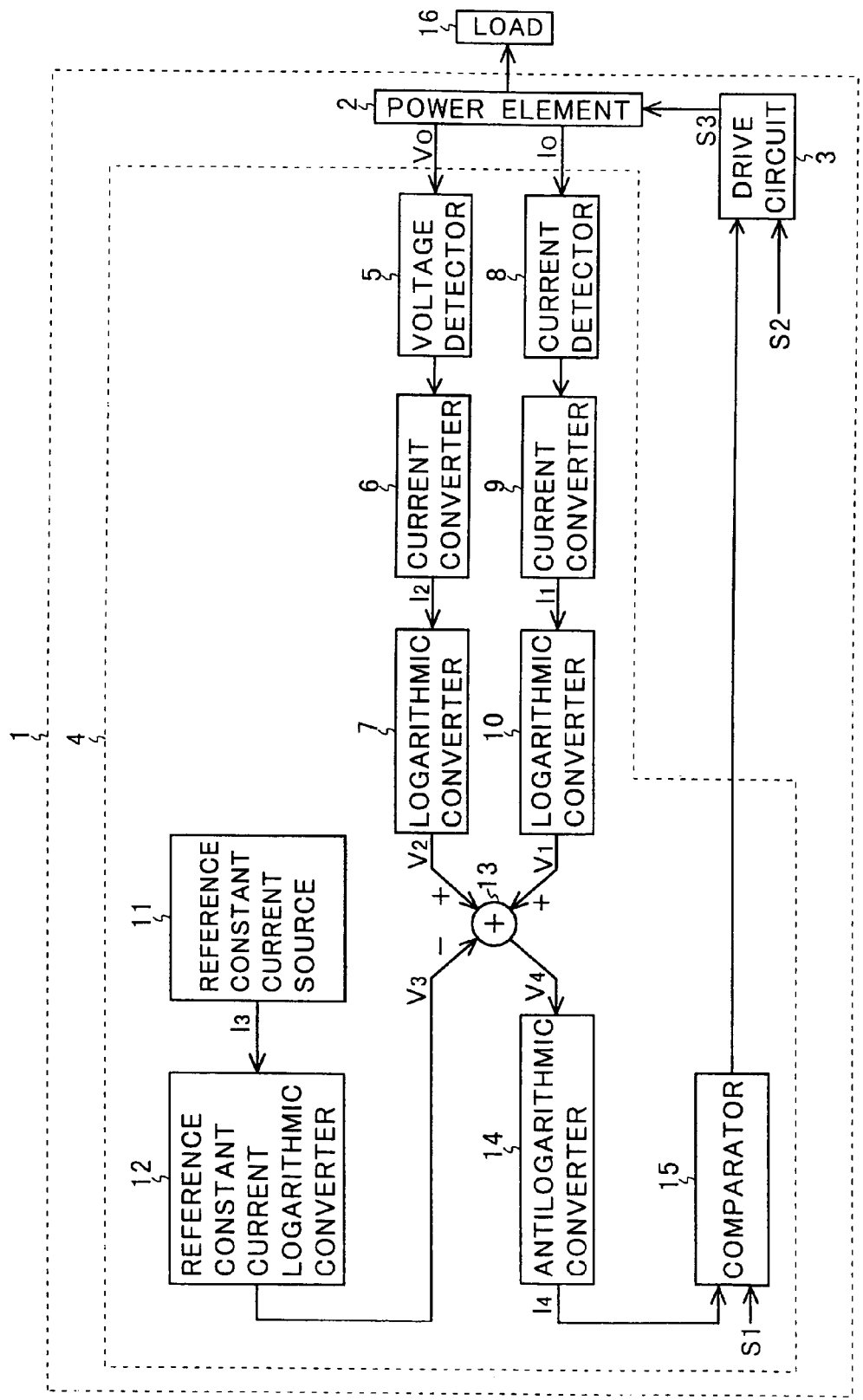
FIG. 1 is a diagram showing an example of the configuration of a semiconductor device embodying the invention.

FIG. 1 shows an example of the configuration of a semiconductor device embodying the present invention. The semiconductor device 1 embodying the invention is composed of a power element 2, a drive circuit 3, and a power element protection circuit 4. The power element 2 is, for example, a power MOSFET or a power bipolar transistor. The drive circuit 3 feeds, according to a load driving command signal S2, a drive signal S3 to the control electrode of the power element 2 (i.e., if the power element 2 is a power MOSFET, the gate thereof or, if it is a power bipolar transistor, the base thereof) to drive the power element 2. The power element 2, in its driven state, supplies the semiconductor device 1 with electric power 16.

The power element protection circuit 4 is provided with: a voltage detector 5 that detects the voltage drop $V_O$ across the power element 2 (i.e., if the power element 2 is a power MOSFET, the drain-source voltage thereof or, if it is a power bipolar transistor, the collector-emitter voltage thereof) and that outputs a voltage proportional to the detected voltage $V_O$; a current converter 6 that converts the output voltage of the voltage detector 5 into a current; and a logarithmic converter 7 that logarithmically converts the output current $I_2$ of the current converter 6.

The power element protection circuit 4 is also provided with: a current detector 8 that detects the current $I_O$ flowing through the power element 2 (i.e., if the power element 2 is a power MOSFET, the drain current thereof or, if it is a power bipolar transistor, the collector current thereof) and that outputs a current proportional to the detected current $I_O$; a current converter 9 that generates a current proportional to the output current of the current detector 8; and a logarithmic converter 10 that logarithmically converts the output current $I_1$ of the current converter 9.

The power element protection circuit 4 is further provided with: a reference constant current source 11; a reference constant current logarithmic converter 12 that logarithmically converts the reference constant current $I_3$ outputted from the reference constant current source 11; a calculator 13 that adds together the output voltage $V_2$ of the logarithmic converter 7 and the output voltage $V_1$ of the logarithmic converter 10, then subtracts from the sum the output voltage $V_3$ of the reference constant current logarithmic converter 12, and that then outputs the result; an antilogarithmic converter 14 that antilogarithmically converts the output voltage $V_4$ of the calculator 13; and a comparator 15 that compares the output current $I_4$ of the antilogarithmic converter 14 with a limited power command signal S1.

When the level of the output current $I_4$, of the antilogarithmic converter 14 is higher than that of the limited power command signal S1, irrespective of the load driving command signal S2, the comparator 15 keeps the drive signal S3 in a state in which it drives the power element 2 within a limit. Incidentally, the circuit that generates the limited power command signal S1 may be incorporated in or externally fitted to the power element protection circuit 4; the circuit that generates the load driving command signal S2 may be incorporated in or externally fitted to the semiconductor device 1.

In the power element protection circuit 4, the power dissipation in the power element 2 is calculated from the current flowing through the power element 2 and the voltage drop across the power element 2. Here, this is achieved not by directly multiplying together the current flowing through the power element 2 and the voltage drop across the power element 2, but by first logarithmically converting the current flowing through the power element 2 and the voltage drop across the power element 2 individually, then adding together the results, then subtracting a predetermined value from the sum, and then antilogarithmically converting the result so as to ultimately calculate the power dissipation in the power element 2. Calculating the power dissipation in the power element 2 by performing addition and subtraction and without performing multiplication in this way helps simplify the circuit configuration and thus makes integration easy. Moreover, what is detected here is not temperature, which is an indirect factor, but the power dissipation in the power element, and this permits accurate control of the heat generated. Thus, it is possible to limit the generation of transient heat resulting from short-circuiting to the supply-voltage or ground line or short-circuiting on the part of the load, and thereby to make the power element far less likely to break down.

Figure 2:
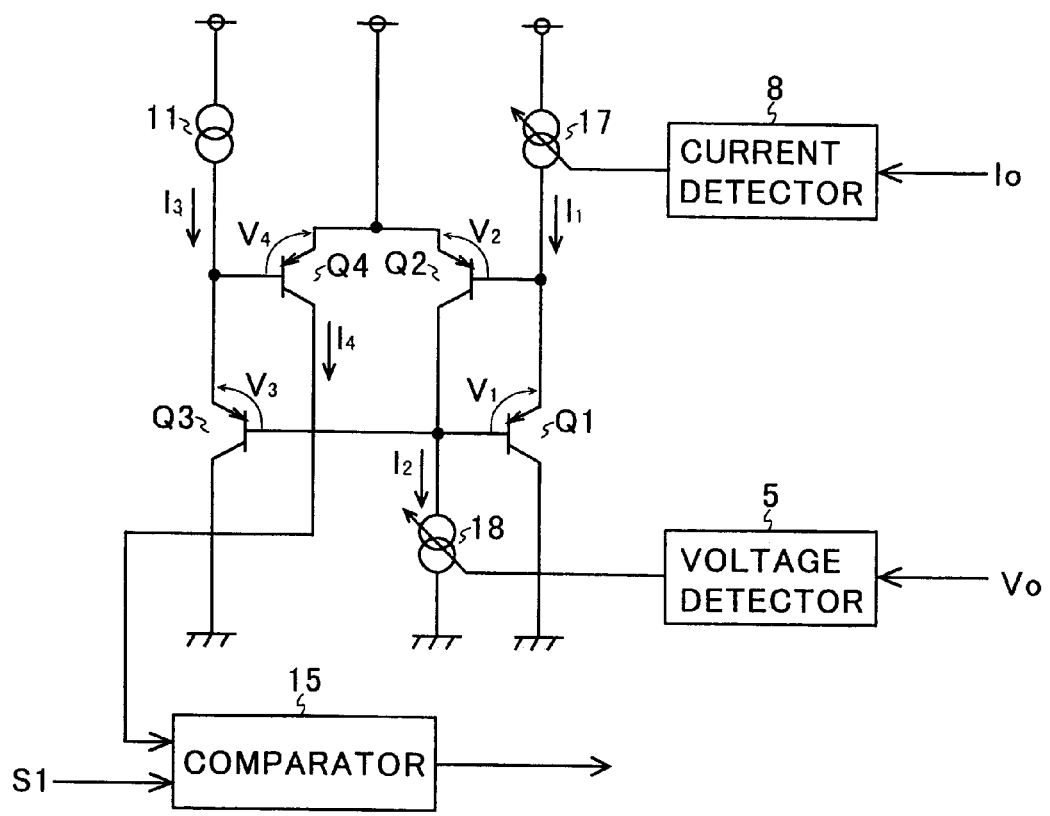
FIG. 2 is a diagram showing an example of the circuit configuration of a power element protection circuit embodying the invention.

Next, the circuit configuration of the power element protection circuit 4 will be described. FIG. 2 shows an example of the circuit configuration of the power element protection circuit 4. In FIG. 2, such circuit elements as are found also in FIG. 1 are identified with the same reference numerals or symbols, and their detailed explanations will not be repeated.

A current source 17 that outputs a current $I_1$, proportional to the output current of the current detector 8 receives, at one end thereof, a supply voltage, and has the other end thereof connected to the emitter of a pnp-type transistor Q1 and to the base of a pnp-type transistor Q2. The collector of the transistor Q1 is grounded.

A current source 18 that outputs a current $I_2$ proportional to the output voltage of the voltage detector 5 is grounded at one end thereof, and has the other end thereof connected to the collector of the transistor Q2, to the base of the transistor Q1, and to the base of a pnp-type transistor Q3. The emitter of the transistor Q2 and the emitter of a pnp-type transistor Q4 are connected together, and the supply voltage is applied to the node between them.

The reference constant current source 11, which outputs a reference constant current $I_3$, receives, at one end thereof, the supply voltage, and has the other end thereof connected to the emitter of the transistor Q3 and to the base of the transistor Q4. The collector of the transistor Q3 is grounded, and the collector of the transistor Q4 is connected to the comparator 15.

Configured as described above, the power element protection circuit shown in FIG. 2 operates as follows. In the following description of the operation, the base currents of the transistors will be ignored. The current detector 8 outputs a current proportional to the current $I_O$ [A] flowing through the power element 2, and the current source 17 outputs a current $I_1$ [A] proportional to the output current of the current detector 8. Thus, Equation (1) below holds. In Equation (1), $K_1$ [A/A] is a conversion coefficient.

$$I_1 = K_1 \cdot I_O \qquad (1)$$

The voltage detector 5 outputs a voltage proportional to the voltage drop $V_O$ [V] across the power element 2, and the current source 18 outputs a current $I_2$ [A] proportional to the output voltage of the voltage detector 5. Thus, Equation (2) below holds. In Equation (2), $K_2$ [A/A] is a conversion coefficient.

$$I_2 = K_2 \cdot V_O \tag{2}$$

The transistor Q1 receives, as the emitter current thereof, the output current $I_1$ of the current source 17, and outputs the base-emitter voltage $V_1$ thereof, which is the result of logarithmic conversion of the emitter current thereof. Between the emitter current $I_1$ [A] and the base-emitter voltage $V_1$ [V] of the transistor Q1, a diode equation given by Equation (3) below holds. In Equation (3), $V_T$ [V] represents the thermovoltage, which is given as k·T/q (where k represents the Boltzmann constant; T represents the absolute temperature; and q represents the unit charge of the electron, which is about 26 [mV] at room temperature). The symbol $I_S$ [A] represents the reverse collector saturation current, which is a constant that depends on the fabrication process of the power element protection circuit.

$$V_1 = V_T \cdot \ln(I_1/I_S) \tag{3}$$

The transistor Q2 receives, as the collector current thereof, the output current $I_2$ of the current source 18, and outputs the base-emitter voltage $V_2$ thereof, which is the result of logarithmic conversion of the emitter current thereof, which in turn is equal to the collector current thereof. Between the emitter current $I_2$ [A] and the base-emitter voltage $V_2$ [V] of the transistor Q2, a diode equation given by Equation (4) below holds. In Equation (4), the variables $V_T$ and $I_S$ are the same as those used in Equation (3).

$$V_2 = V_T \cdot \ln(I_2/I_S) \tag{4}$$

The transistor Q3 receives, as the emitter current thereof, the reference constant current $I_3$ of the reference constant current source 11, and outputs the base-emitter voltage $V_3$ thereof, which is the result of logarithmic conversion of the emitter current thereof. Between the emitter current $I_3$ [A] and the base-emitter voltage $V_3$ [V] of the transistor Q3, a diode equation given by Equation (5) below holds. In Equation (5), the variables $V_T$ and $I_S$ are the same as those used in Equation (3).

$$V_3 = V_T \cdot \ln(I_3/I_S) \tag{5}$$

Moreover, the base-emitter voltages $V_1$ [V] to $V_4$ [V] of the transistors Q1 to Q4 fulfill the relationship given by Equation (6) below.

$$V_3 + V_4 = V_1 + V_2 \tag{6}$$

Based on Equations (1) to (6) above, the base-emitter voltage $V_4$ [V] of the transistor Q4 is given by Equation (7) below.

$$\begin{aligned} V_4 &= V_1 + V_2 - V_3 \\ &= V_T \cdot \ln\left(\frac{I_1}{I_S}\right) + V_T \cdot \ln\left(\frac{I_2}{I_S}\right) - V_T \cdot \ln\left(\frac{I_3}{I_S}\right) \\ &= V_T \cdot \ln\left(\frac{K_1 \cdot I_O}{I_S}\right) + V_T \cdot \ln\left(\frac{K_2 \cdot V_O}{I_S}\right) - V_T \cdot \ln\left(\frac{I_3}{I_S}\right) \\ &= V_T \cdot \ln\left(\frac{K_1 \cdot K_2 \cdot I_O \cdot V_O}{(I_S)^2}\right) - V_T \cdot \ln\left(\frac{I_3}{I_S}\right) \\ &= V_T \cdot \ln\left(\frac{K_1 \cdot K_2 \cdot I_O \cdot V_O}{I_S \cdot I_3}\right) \end{aligned} \tag{7}$$

The transistor Q4 outputs, to the comparator 15, the collector current $I_4$ thereof, which is equal to the emitter current thereof, which in turn is the result of antilogarithmic conversion of the base-emitter voltage $V_4$ thereof. Between the emitter current $I_4$ [A] and the base-emitter voltage $V_4$ of the transistor Q4, a diode equation given by Equation (8) below holds. In Equation (8), the variables $V_T$ and $I_S$ are the same as those used in Equation (3).

$$I_4 = I_S \cdot \exp(V_4/V_T) \tag{8}$$

Based on Equations (7) and (8), Equation (9) below holds.

$$I_4 = K_1 \cdot K_2 \cdot V_O \cdot I_O / I_3 \tag{9}$$

As will be clear from Equation (9), the current $I_4$ outputted from the transistor Q4 to the comparator 15 has a level proportional to the power dissipation ($V_O \cdot I_O$) in the power element 2. Accordingly, it is advisable to set the level of the limited power command signal S1 in consideration of the proportionality constant ($K_1 \cdot K_2/I_3$) between the current $I_4$ and the power dissipation ($V_O \cdot I_O$) in the power element 2.

The power element protection circuit shown in FIG. 2 incorporates a small number of transistors, and thus operates at high speed.

Even if the sum of the voltages $V_1$ and $V_2$ is subjected to antilogarithmic conversion according to a diode equation, the term of the reverse collector current $I_S$ cannot be canceled (see Equations (7) and (8)). For this reason, in the power element protection circuit shown in FIG. 2, the voltage $V_3$ obtained by logarithmically converting the reference constant current $I_3$ according to a diode equation is subtracted from the sum of the voltages $V_1$ and $V_2$ to obtain the voltage $V_4$ (see Formula (6)), and this voltage $V_4$ is then antilogarithmically converted according to a diode equation to obtain the current $I_4$, which is proportional to the power dissipation in the power element 2 and from which the term of the reverse collector current $I_S$ has been canceled.

Figure 3:
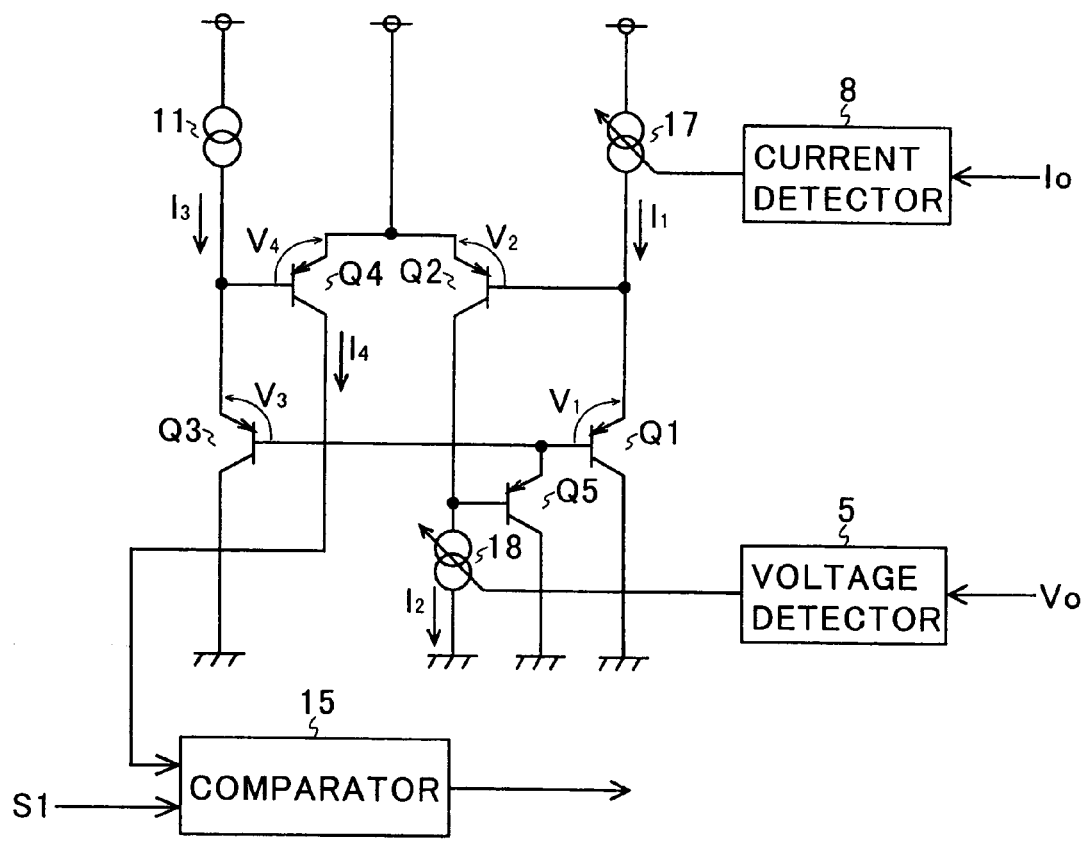
FIG. 3 is a diagram showing another example of the circuit configuration of a power element protection circuit embodying the invention.

FIG. 3 shows another example of the circuit configuration of the power element protection circuit 4. In FIG. 3, such circuit elements as are found also in FIG. 2 are identified with the same reference numerals or symbols, and their detailed explanations will not be repeated. As compared with the power element protection circuit shown in FIG. 2, the power element protection circuit shown in FIG. 3 is additionally provided with a pnp-type transistor Q5 so that the node between the bases of the transistors Q1 and Q3 is separated from the node between the collector of the transistor Q2 and the current source 18.

The emitter of the transistor Q5 is connected to the nodes between the bases of the transistors Q1 and Q3, and the base of the transistor Q5 is connected to the node between the collector of the transistor Q2 and the current source 18. The collector of the transistor Q5 is grounded.

In the power element protection circuit shown in FIG. 3, the error produced between the output current of the current source 18 and the collector current of the transistor Q2 by the base currents of the transistors Q1 and Q3 can be reduced to $1/h_{fe}$ as compared to in the power element protection circuit shown in FIG. 2. This makes it possible to more accurately detect the power dissipation in the power element 2 than in the power element protection circuit shown in FIG. 2. Incidentally, the symbol $h_{fe}$ represents the current gain of the transistor Q5 as observed when it is operated in emitter-common connection with the output short-circuited.

Figure 4:
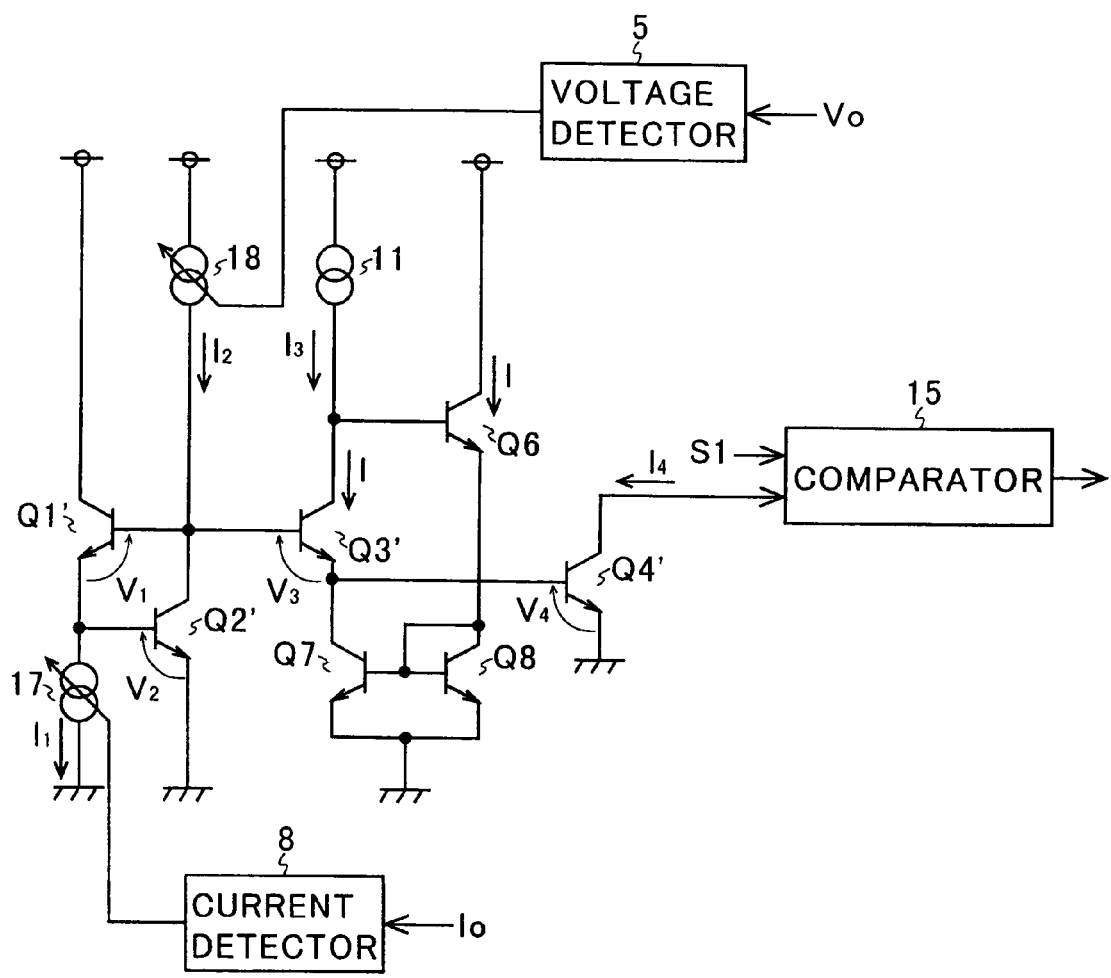
FIG. 4 is a diagram showing still another example of the circuit configuration of a power element protection circuit embodying the invention.

FIG. 4 shows still another example of the circuit configuration of the power element protection circuit 4. Whereas the power element protection circuit shown in FIG. 2 uses pnp-type transistors Q1 to Q4, the power element protection circuit shown in FIG. 4 uses npn-type transistors Q1' to Q4'. Even then, the power element protection circuits shown in FIGS. 2 and 4 have basically the same configuration and operate basically in the same manner, and therefore, in the following description, only the distinctive features of the power element protection circuit shown in FIG. 4 will be described.

The power element protection circuit shown in FIG. 4 is further provided with npn-type transistors Q6 to Q8. The supply voltage is applied to the collector of the transistor Q6. The base of the transistor Q6 is connected to the reference constant current source 11 and to the collector of the transistor Q3'. The emitter of the transistor Q6 is connected to the base of the transistor Q7 and to the base and collector of the transistor Q8. The collector of the transistor Q7 is connected to the emitter of the transistor Q3' and to the base of the transistor Q4'. The emitters of the transistors Q7 and Q8 are grounded.

In this configuration, the current mirror circuit formed by the transistors Q7 and Q8 keeps equal the current flowing through the transistor Q3' and the current flowing through the transistor Q6. Assuming that the base current of the transistor Q6 is $1/\beta$ times the collector current of the transistor Q6, Equation (10) below holds.

$$I_3 = (1 + 1/\beta)I \qquad (10)$$

Here, $1 << \beta$, and hence $I_3 \approx I$. By contrast, in the power element protection circuit shown in FIG. 2, the sum of the reference constant current $I_3$ and the base current of the transistor Q4 flows through the transistor Q3. Thus, the error between the current I flowing through the transistor Q3' and the reference constant current $I_3$ in the power element protection circuit shown in FIG. 4 is smaller than the error between the current flowing through the transistor Q3 and the reference constant current $I_3$ in the power element protection circuit shown in FIG. 2. Accordingly, the power element protection circuit shown in FIG. 4 can more accurately detect the power dissipation in the power element 2 than the power element protection circuit shown in FIG. 2.

In the power element protection circuits shown in FIGS. 2 and 3 described above, pnp-type transistors are used. It is, however, also possible to adopt there a circuit configuration employing npn-transistors instead. In a case where, for example, a cooling fan provided to cool the power element with air is at fault, even if the power dissipation in the power element is within the permissible range, the temperature of the power element may exceed the permissible range. Thus, it is preferable to use, in combination, temperature protection achieved by a thermal shutdown circuit so as to further reduce the likeliness of the power element breaking down.

Here, making the detection accuracy of the current detector 8 higher results in making higher the accuracy with which the power dissipation in the power element is detected. Thus, it is advisable to use, as the current detector 8, a current detector 8 that operates with satisfactorily high detection accuracy. Now, embodiments of the current detector 8 that operate with satisfactorily high detection accuracy will be described.

Figure 5:
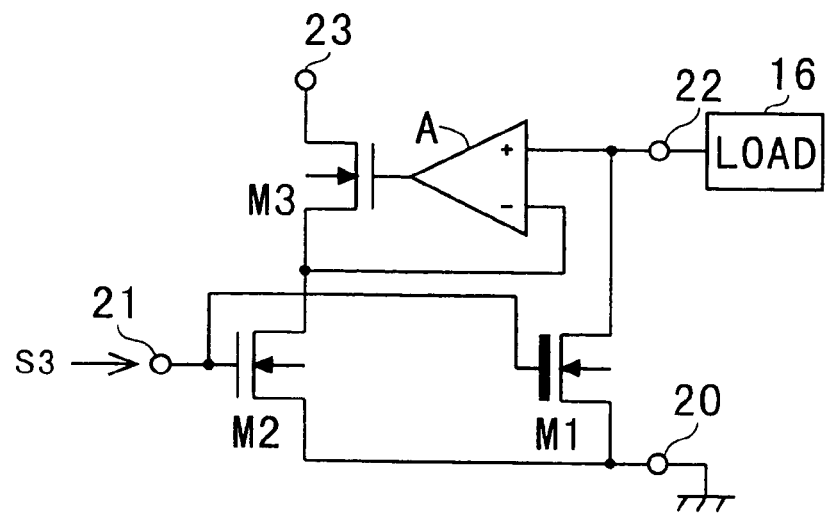
FIG. 5 is a circuit block diagram showing an example of the configuration of the circuit including the current detector of a first embodiment of the invention.

First, a first embodiment of the current detector 8 will be described below with reference to the drawings. FIG. 5 is a circuit block diagram showing the configuration including only the power element 2, the current detector 8, and a load 16.

The circuit shown in FIG. 5 is composed of: a power transistor M1, serving as the power element 2, that feeds a current to a load 16; a transistor M2 of which the gate and source are connected to the gate and source, respectively, of the power transistor M1; an operational amplifier A of which the non-inverting input terminal is connected to the drain of the power transistor M1 and of which the inverting input terminal is connected to the drain of the transistor M2; and a transistor M3 of which the gate is connected to the output terminal of the operational amplifier A and of which the source is connected to the drain of the transistor M2.

The sources of the power transistor M1 and the transistor M2 are grounded via a ground terminal 20, and a control signal S3 is fed via a control terminal 21 to the gates of the power transistor M1 and the transistor M2. The drain of the power transistor M1 is connected via a load terminal 22 to a load 16. The drain of the transistor M3 is connected to a detection terminal 23 via which a detection current is fed out. Here, the power transistor M1 and the transistors M2 and M3 are all N-channel MOSFETs. The transistor M3 and the operational amplifier A constitute a negative feedback circuit.

In the circuit shown in FIG. 5, the voltages at the inverting and non-inverting input terminals of the operational amplifier A are approximately equal, and thus the voltages at the drains of the power transistor M1 and the transistor M2 are approximately equal. As a result, since the power transistor M1 and the transistor M2 have their sources connected together and have their gates connected together, the voltages at their drains are equal, the voltages at their sources are equal, and the voltage at their gates are equal.

By making the voltages applied to the different electrodes of the power transistor M1 equal to the voltages applied to the corresponding electrodes of the transistor M2 in this way, the drain current through the transistor M2 can be made proportional to the drain current through the power transistor M1. Specifically, let the gate width and gate length of the power transistor M1 be W1 and L1, respectively, and let the gate width and gate length of the transistor M2 be W2 and L2, respectively. Then, with respect to the drain current I1 through the power transistor M1, the drain current I2 through the M2 is given as I1×(W2/L2)/(W1/L1). Here, whereas the drain current through the transistor M2 is of the order of several $\mu$A to several ten $\mu$A, the drain current through the power transistor M1 is of the order of several hundred $\mu$A.

Moreover, the provision of the transistor M3 permits the output voltage of the operational amplifier A to be used for the sole purpose of being sampled as the gate voltage of the transistor M3. This helps to prevent a current from flowing out of the operational amplifier A as part of the drain current of the transistor M3, or part of the current flowing through the detection terminal 23 from flowing into the operational amplifier A, as opposed to in a case where the transistor M2 is connected through a resistor or the like directly to the output terminal of the operational amplifier A. As a result, the current appearing at the detection terminal 23 is not influenced by a current flowing into or out of the operational amplifier A, and thus the current appearing at the detection terminal 23 represents the drain current of the transistor M2, which is proportional to the drain current of the power transistor M1.

Figure 6:
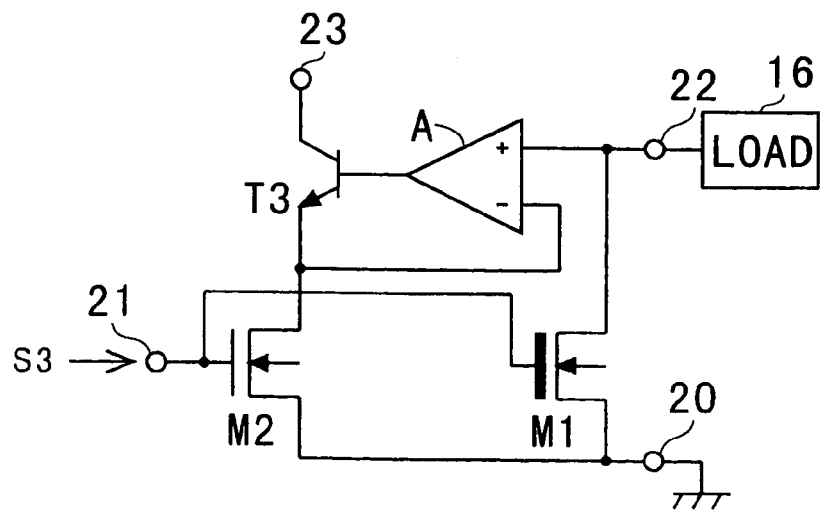
FIG. 6 is a circuit block diagram showing another example of the configuration of the circuit including the current detector of the first embodiment.

In FIG. 5, an N-channel MOSFET is used as the transistor M3. It is, however, also possible to use, as shown in FIG. 6, an npn-type bipolar transistor as a transistor T3 in place of the transistor M3. In this case, the transistor T3 has its collector connected to the detection terminal 23, has its base connected to the output terminal of the operational amplifier A, and has its emitter connected to the drain of the transistor M2. That is, the transistor T3 and the operational amplifier A constitute a negative feedback circuit. Since the base current of this transistor T3 is negligible as compared with its collector current, just as in the case shown in FIG. 5, the current appearing at the detection terminal 23 represents the drain current of the transistor M2, which is proportional to the drain current of the power transistor M1.

Figure 7A:
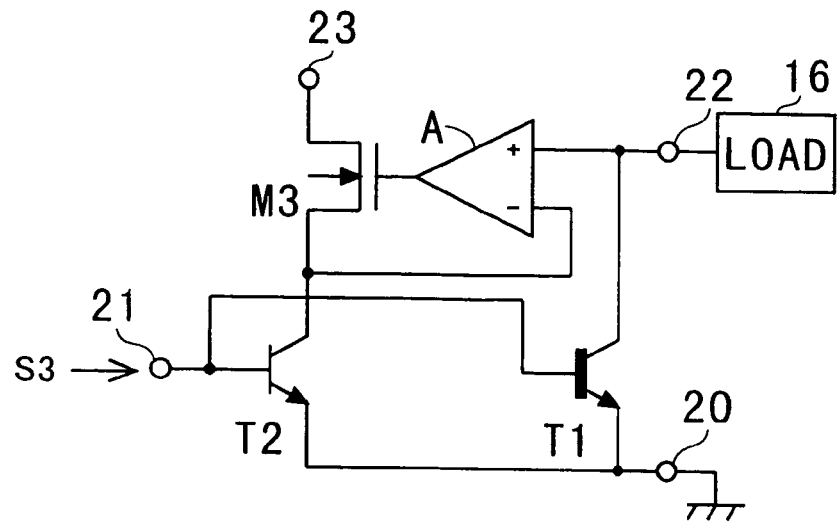
FIGS. 7A and 7B are circuit block diagrams showing still other examples of the configuration of the circuit including the current detector of the first embodiment.
Figure 7B:
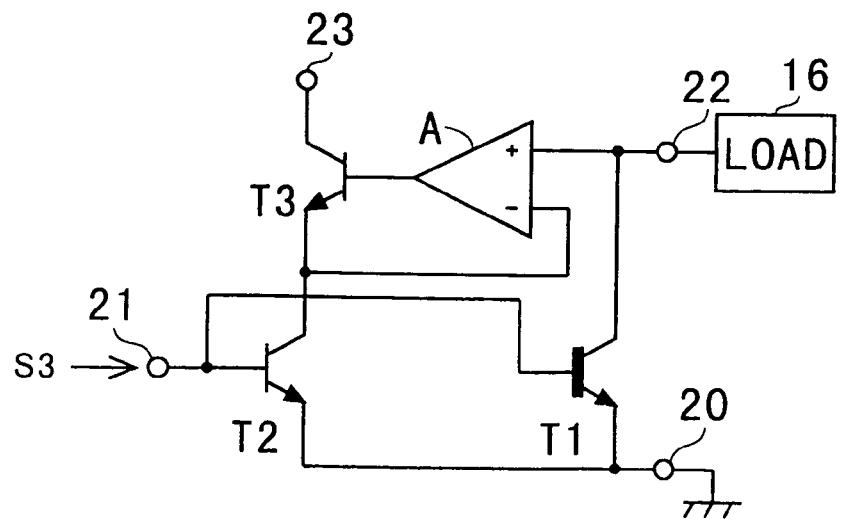

In FIGS. 5 and 6, an N-channel MOSFET is used as the power transistor M1. It is, however, also possible to use, as shown in FIGS. 7A and 7B, an npn-type bipolar transistor as a power transistor T1 in place of the power transistor M1. In this case, in place of the transistor M2, which is an N-channel MOSFET, an npn-type bipolar transistor is used as a transistor T2.

The non-inverting and inverting input terminals of the operational amplifier A are connected to the collectors of the power transistor T1 and the transistor T2, respectively. The emitters of the power transistor T1 and the transistor T2 are connected to the ground terminal 20, and the bases of the power transistor T1 and the transistor T2 are connected to the control terminal 21. FIG. 7A shows a case where an N-channel MOSFET is used as the transistor M3, and FIG. 7B shows a case where an npn-type bipolar transistor is used as the transistor T3.

In the configurations shown in FIGS. 7A and 7B, the operational amplifier A and the transistor M3 or T3 have the same functions as the operational amplifier A and the transistor M3 or T3 in FIGS. 5 and 6. Moreover, the voltages at the emitters of the power transistor T1 and the transistor T2 are equal, the voltages at their collectors are equal, and the voltages at their bases are equal. Thus, through the power transistor T1 and the transistor T2 flow collector currents that are proportional to their emitter areas. As a result, let the emitter areas of the power transistor T1 and the transistor T2 be s1 and s2, respectively, then, with respect to the collector current I1 of the power transistor T1, the collector current I2 through the transistor T2 is I1×s2/s1, and this collector current I2 appears at the detection terminal 13.

Figure 8A:
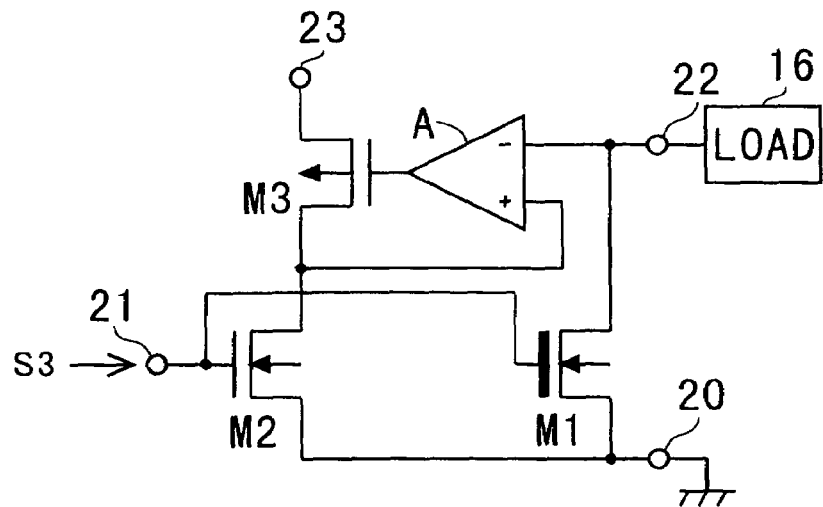
FIGS. 8A to 8D are circuit block diagrams showing still other examples of the configuration of the circuit including the current detector of the first embodiment.
Figure 8B:
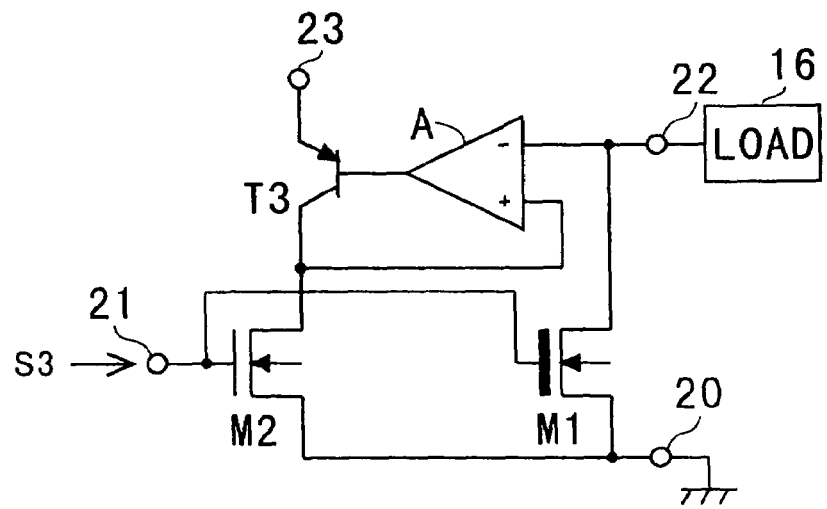
Figure 8C:
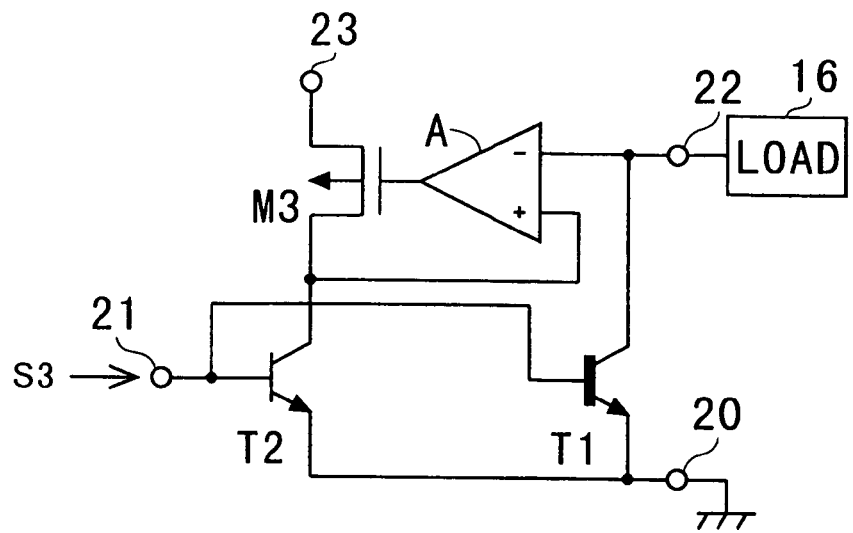
Figure 8D:
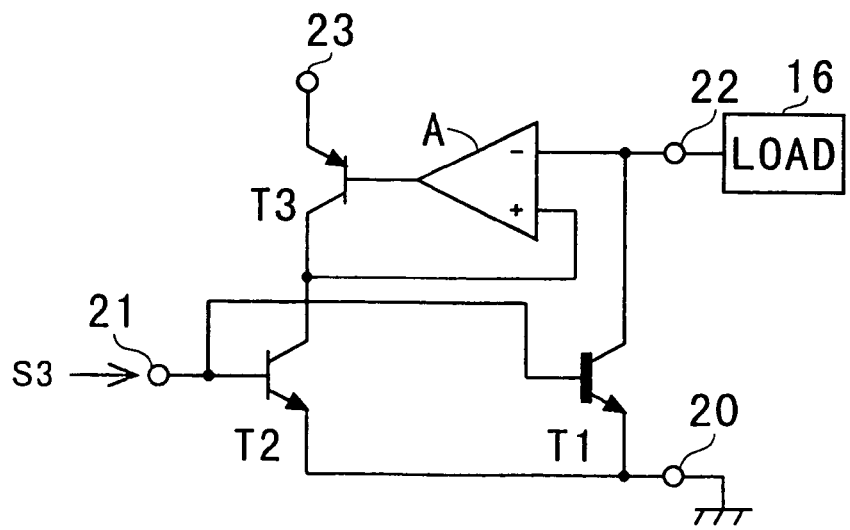

In FIGS. 5, 6, 7A, and 7B, the power transistor M1 or T1 is connected to the non-inverting input terminal of the operational amplifier A and the transistor M2 or T2 is connected to the inverting input terminal of the operational amplifier A. It is, however, also possible to reverse the connection to the non-inverting and inverting input terminals of the operational amplifier A. Specifically, in that case, as shown in FIGS. 8A and 8B, the drains of the power transistor M1 and the transistor M2 are connected to the inverting and non-inverting input terminals, respectively, of the operational amplifier A, or, as shown in FIGS. 8C and 8D, the collectors of the power transistor T1 and the transistor T2 are connected to the inverting and non-inverting input terminals, respectively, of the operational amplifier A.

In this case, the transistor M3 or T3 connected to the output terminal of the operational amplifier A is a P-channel MOSFET or pnp-type bipolar transistor, respectively, so that the operational amplifier A and the transistor M3 or T3 constitute a negative feedback circuit. Specifically, as shown in FIGS. 8A and 8C, the transistor M3 has its gate connected to the output terminal of the operational amplifier A, has its source connected to the detection terminal 23, and has its drain connected to the non-inverting input terminal of the operational amplifier A; or, as shown in FIGS. 8B and 8D, the transistor T3 has its base connected to the output terminal of the operational amplifier A, has its emitter connected to the detection terminal 23, and has its collector connected to the non-inverting input terminal of the operational amplifier A.

In FIGS. 5, 6, 7A, 7B, and 8A to 8D, the power transistor M1 and the transistor M2 are N-channel MOSFETs, or the power transistor T1 and the transistor T2 are npn-type bipolar transistors. It is, however, also possible to use, as shown in FIGS. 9A to 9D, P-channel MOSFETs as the power transistor M1 and the transistor M2, or pnp-type bipolar transistors as the power transistor T1 and the transistor T2.

Figure 9A:
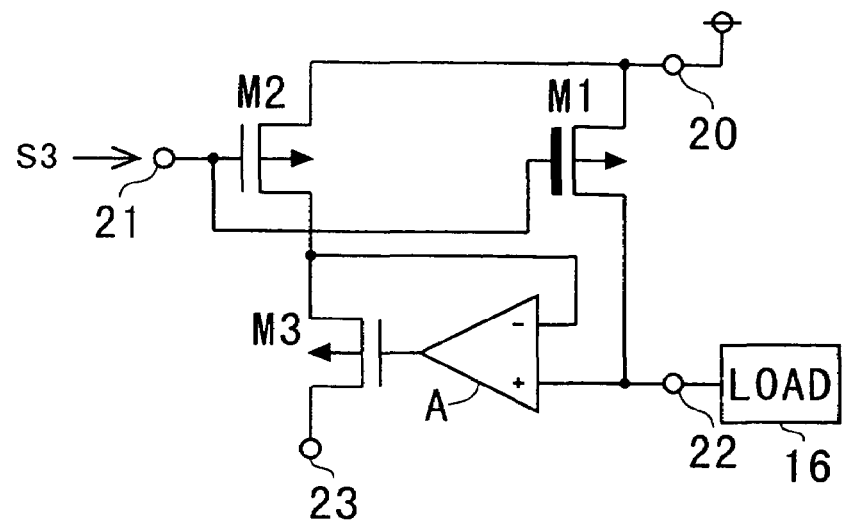
FIGS. 9A to 9D are circuit block diagrams showing still other examples of the configuration of the circuit including the current detector of the first embodiment.
Figure 9B:
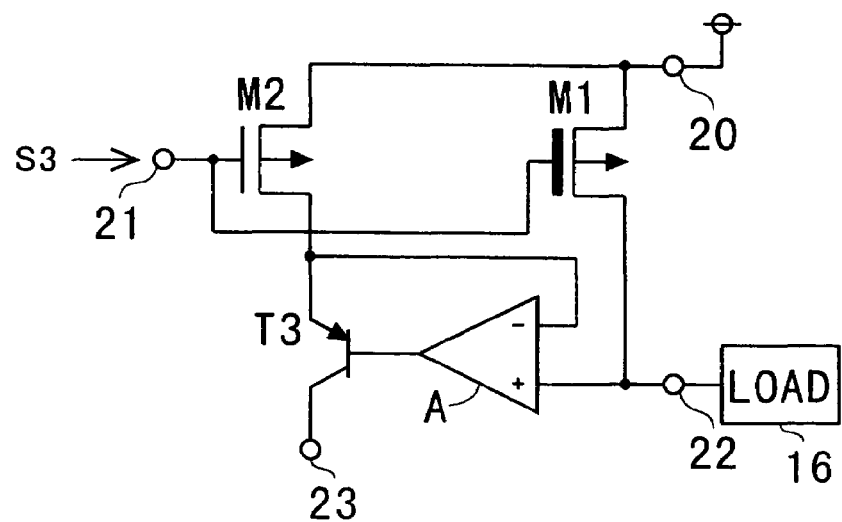

In this case, as shown in FIGS. 9A and 9B, the drains of the power transistor M1 and the transistor M2 are connected to the non-inverting and inverting input terminals, respectively, of the operational amplifier A. Moreover, a P-channel MOSFET or pnp-type bipolar transistor is used as the transistor M3 or T3, respectively, and the non-inverting input terminal of the operational amplifier A is connected to the output terminal 22. Thus, the circuit configurations shown in FIGS. 9A and 9B have, though with the opposite polarity, the same interconnection as those shown in FIGS. 5 and 6.

Figure 9C:
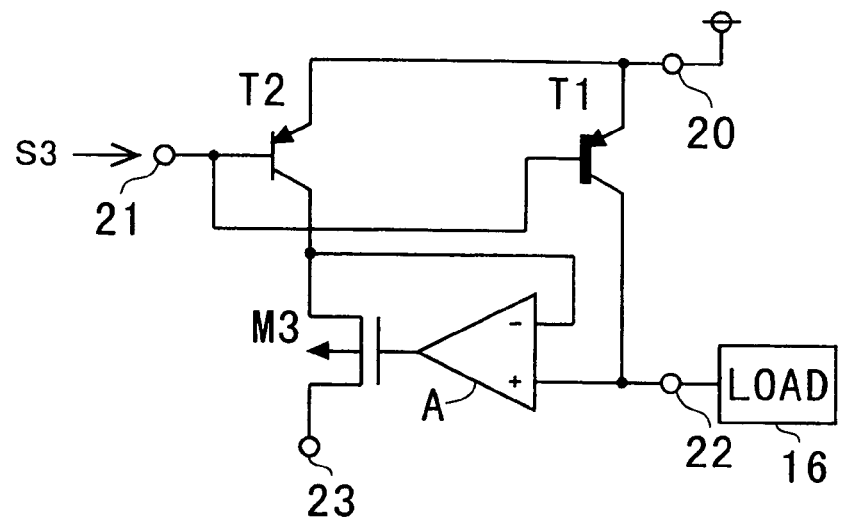
Figure 9D:
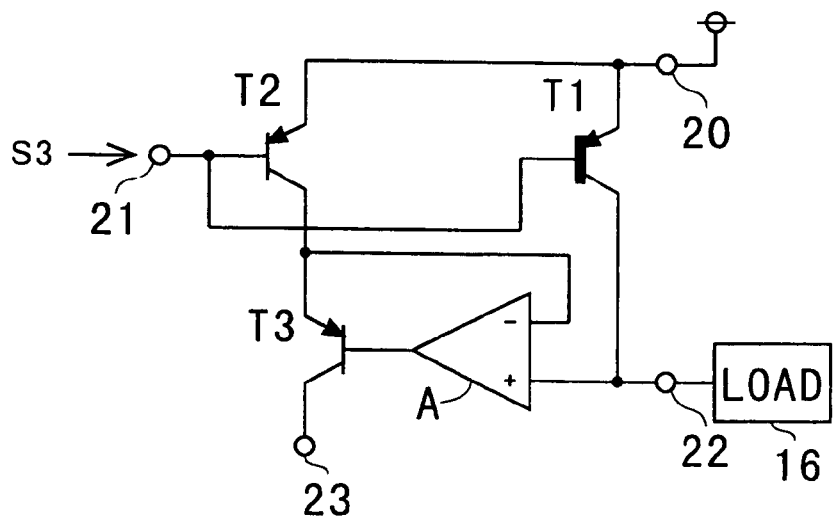

Alternatively, as shown in FIGS. 9C and 9D, the collectors of the power transistor T1 and the transistor T2 are connected to the non-inverting and inverting input terminals, respectively, of the operational amplifier A. Moreover, a P-channel MOSFET or pnp-type bipolar transistor is used as the transistor M3 or T3, respectively, and the non-inverting input terminal of the operational amplifier A is connected to the output terminal 22. Thus, the circuit configurations shown in FIGS. 9C and 9D have, though with the opposite polarity, the same interconnection as those shown in FIGS. 7A and 7B.

Figure 10A:
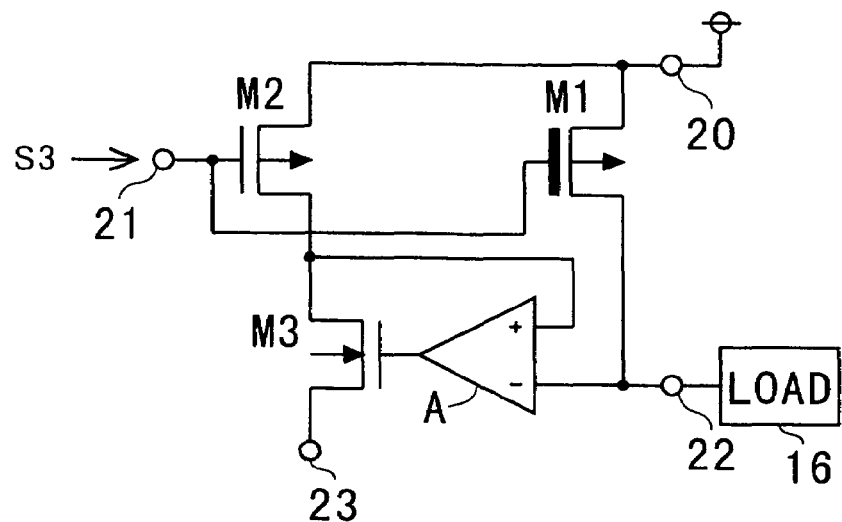
FIGS. 10A to 10D are circuit block diagrams showing still other examples of the configuration of the circuit including the current detector of the first embodiment.
Figure 10B:
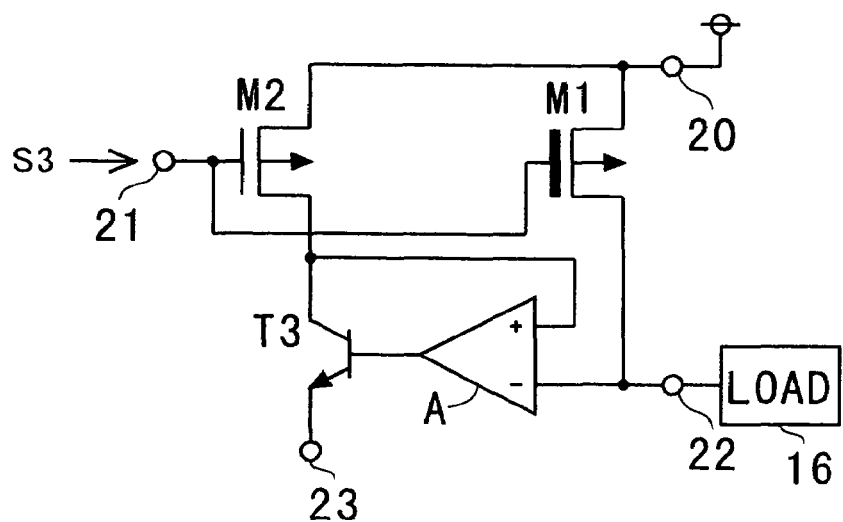

Alternatively, as shown in FIGS. 10A and 10B, the drains of the power transistor M1 and the transistor M2 are connected to the inverting and non-inverting input terminals, respectively, of the operational amplifier A. Moreover, an N-channel MOSFET or npn-type bipolar transistor is used as the transistor M3 or T3, respectively, and the inverting input terminal of the operational amplifier A is connected to the output terminal 22. Thus, the circuit configurations shown in FIGS. 10A and 10B have, though with the opposite polarity, the same interconnection as those shown in FIGS. 8A and 8B.

Figure 10C:
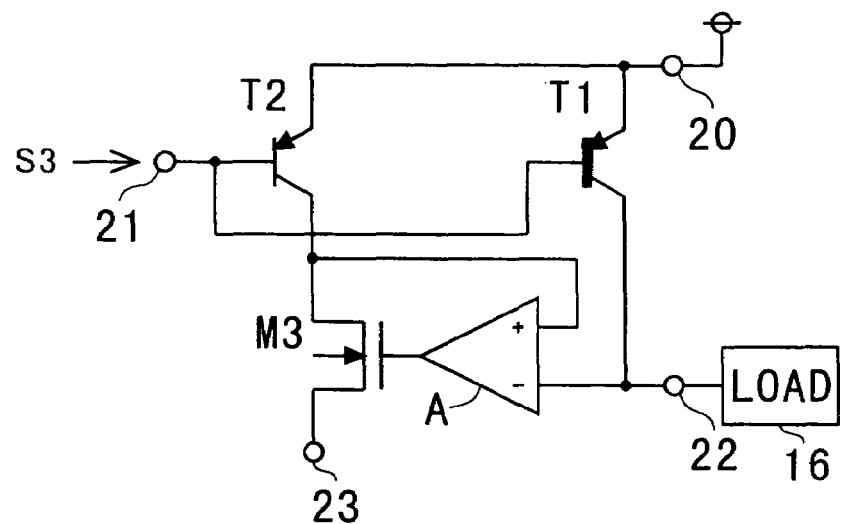
Figure 10D:
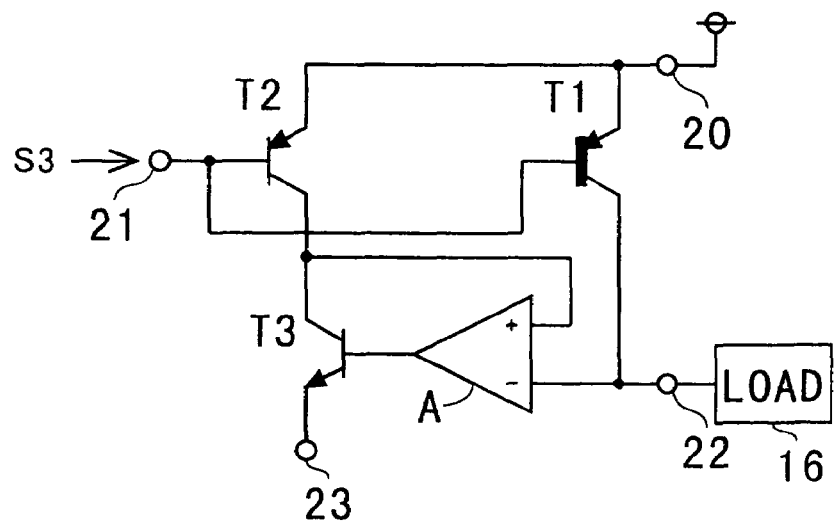

Alternatively, as shown in FIGS. 10C and 10D, the collectors of the power transistor T1 and the transistor T2 are connected to the inverting and non-inverting input terminals, respectively, of the operational amplifier A. Moreover, an N-channel MOSFET or npn-type bipolar transistor is used as the transistor M3 or T3, respectively, and the inverting input terminal of the operational amplifier A is connected to the output terminal 22. Thus, the circuit configurations shown in FIGS. 10C and 10D have, though with the opposite polarity, the same interconnection as those shown in FIGS. 8C and 8D.

Figure 11:
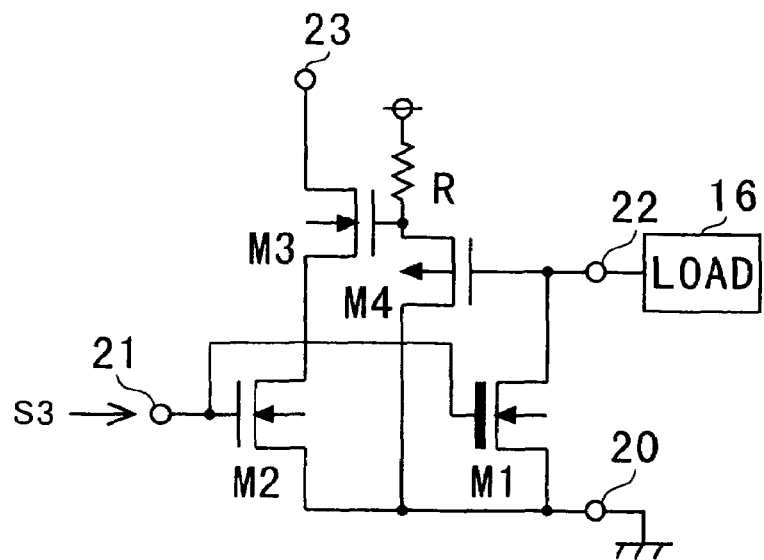
FIG. 11 is a circuit block diagram showing an example of the configuration of the circuit including the current detector of a second embodiment of the invention.

A second embodiment of the current detector 8 will be described below with reference to the drawings. FIG. 11 is a circuit block diagram showing the configuration including only the power element 2, the current detector 8, and a load 16. In FIG. 11, such circuit elements as are found also in FIG. 5 are identified with the same reference numerals or symbols, and their detailed explanations will not be repeated.

The circuit shown in FIG. 11 differs from that shown in FIG. 5 in that the operational amplifier A shown in FIG. 5 is omitted, and that there are instead provided a resistor R and a transistor M4. A supply voltage VDD is fed to one end of the resistor R. The transistor M4 has its source connected to the other end of the resistor R and to the gate of the transistor M3, and has its gate connected to the drain of the power transistor M1. This transistor M4 is a P-channel MOSFET, and has its drain grounded via the ground terminal 20. The transistors M3 and M4 have substantially equal source-gate threshold voltages Vth.

In this configuration, if the drain voltage of the power transistor M1 is assumed to be Va, the drain voltage Va of this power transistor M1 is fed to the gate of the transistor M4, and thus the source voltage of the transistor M4 equals Va+Vth. The source voltage Va+Vth of this transistor M4 is fed to the gate of the transistor M3, and thus the source voltage of the transistor M3 equals Va+Vth− Vth=Va. This makes the drain voltage of the transistor M2 equal to Va, i.e., equal to the drain voltage of the power transistor M1.

Accordingly, the drain voltage, gate voltage, and source voltage of the transistor M2 equal the drain voltage, gate voltage, and source voltage, respectively, of the power transistor M1. Thus, the drain current of the transistor M2 is proportional, by a factor of (Gate Width)/(Gate Length), to the drain current of the power transistor M1. Moreover, the drain voltage of the power transistor M1 is used for the sole purpose of being sampled as the gate voltage of the transistor M4, and the source voltage of the transistor M4 is used for the sole purpose of being sampled as the gate voltage of the transistor M3. This helps to reduce the influence on the drain current of the transistor M2 which is fed out via the detection terminal 23.

Specifically, the drain current of the transistor M3 is not increased or decreased by the current that flows through the circuit constituted by the transistor M4 and the resistor R, but is equal to the drain current of the transistor M2. Moreover, the current that flows through the power transistor M1 is not increased or decreased by the current that flows through the circuit constituted by the transistor M4 and the resistor R, but is equal to the current that flows through the load 16. Thus, as in the first embodiment, the current that appears at the detection terminal 23 is equal to the drain current of the transistor M2, which is proportional to the drain current of the power transistor M1.

In FIG. 11, an N-channel MOSFET is used as the transistor M3 and a P-channel MOSFET is used as the transistor M4. It is, however, also possible to use, as shown in FIG. 12, an npn-type bipolar transistor as a transistor T3 in place of the transistor M3 and an pnp-type bipolar transistor T4 in place of the transistor M4.

In this case, the transistor T3 has its collector connected to the detection terminal 23, has its base connected to the other end of the resistor R, and has its emitter connected to the drain of the transistor M2. Moreover, the transistor T4 has its collector connected to the ground terminal 10, has its base connected to the drain of the power transistor M1, and has its emitter connected to the base of the transistor T3. The base currents of these transistors T3 and T4 are negligible as compared with their collector currents, and therefore, as in the case shown in FIG. 11, the current appearing at the detection terminal 23 represents the drain current of the transistor M2, which is proportional to the drain current of the power transistor M1.

Figure 12:
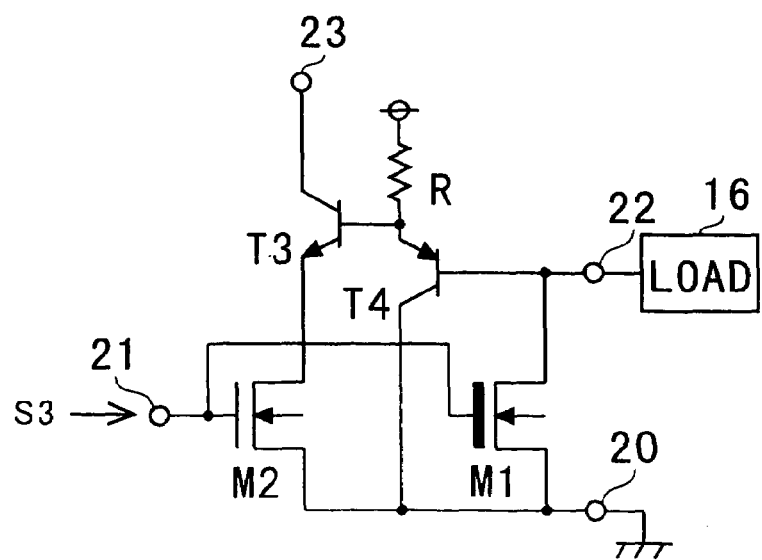
FIG. 12 is a circuit block diagram showing another example of the configuration of the circuit including the current detector of the second embodiment.
Figure 13A:
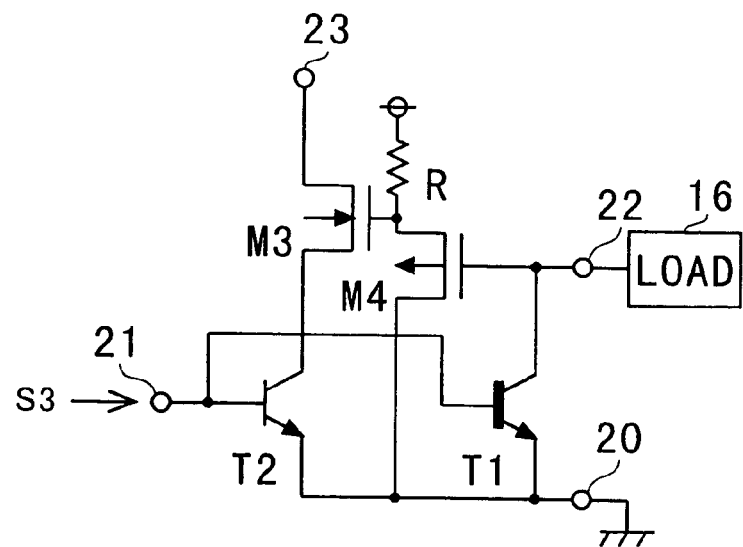
FIGS. 13A and 13B are circuit block diagrams showing still other examples of the configuration of the circuit including the current detector of the second embodiment.
Figure 13B:
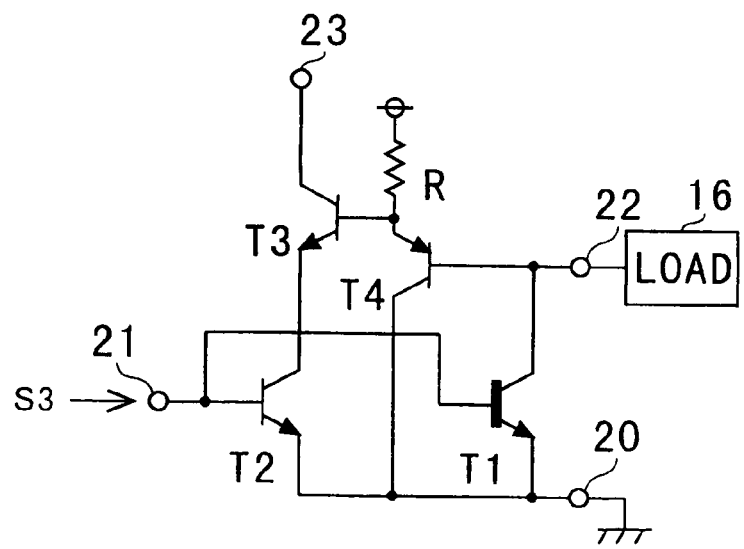

In FIGS. 11 and 12, an N-channel MOSFET is used as the power transistor M1. It is, however, also possible to use, as shown in FIGS. 13A and 13B, an npn-type bipolar transistor as a power transistor T1 in place of the power transistor M1. In this case, in place of the transistor M2, which is an N-channel MOSFET, an npn-type bipolar transistor is used as a transistor T2.

In FIG. 13A, the collector of the power transistor T1 is connected to the gate of the transistor M4, and the collector of the transistor T2 is connected to the source of the transistor M3. In FIG. 13B, the collector of the power transistor T1 is connected to the base of the transistor T4, and the collector of the transistor T2 is connected to the emitter of the transistor T3. Moreover, in FIGS. 13A and 13B, the emitters of the power transistor T1 and the transistor T2 are connected to the ground terminal 20, and the bases of the power transistor T1 and the transistor T2 are connected to the control terminal 21.

In FIGS. 11, 12, 13A, and 13B, N-channel MOSFETs are used as the power transistor M1 and the transistor M2, or npn-type bipolar transistors are used as the power transistor T1 and the transistor T2. It is, however, also possible to use P-channel MOSFETs as the power transistor M1 and the transistor M2, or pnp-type bipolar transistors as the power transistor T1 and the transistor T2.

Figure 14A:
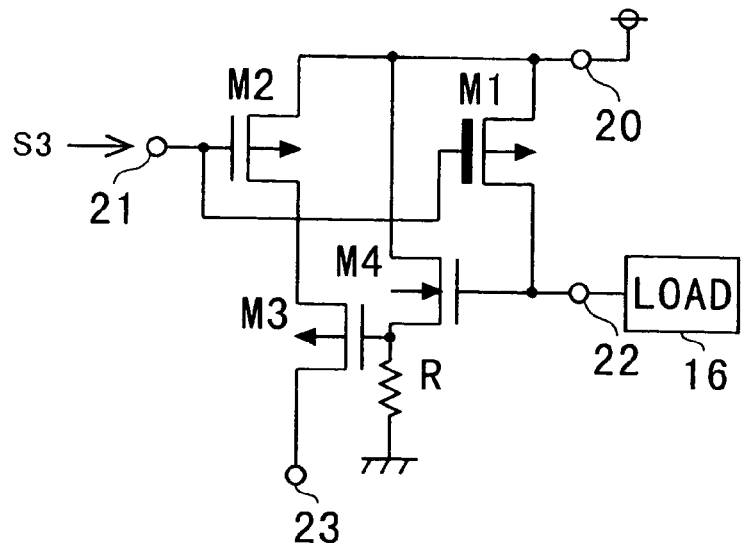
FIGS. 14A to 14D are circuit block diagrams showing still other examples of the configuration of the circuit including the current detector of the second embodiment.
Figure 14B:
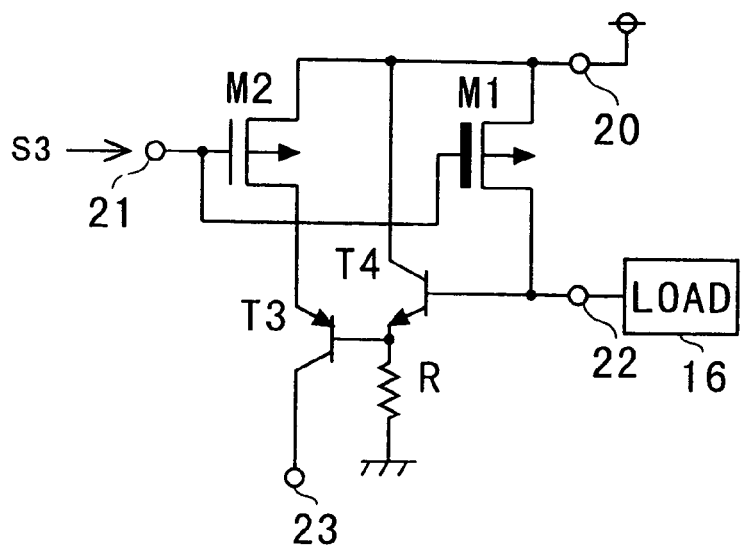
Figure 14C:
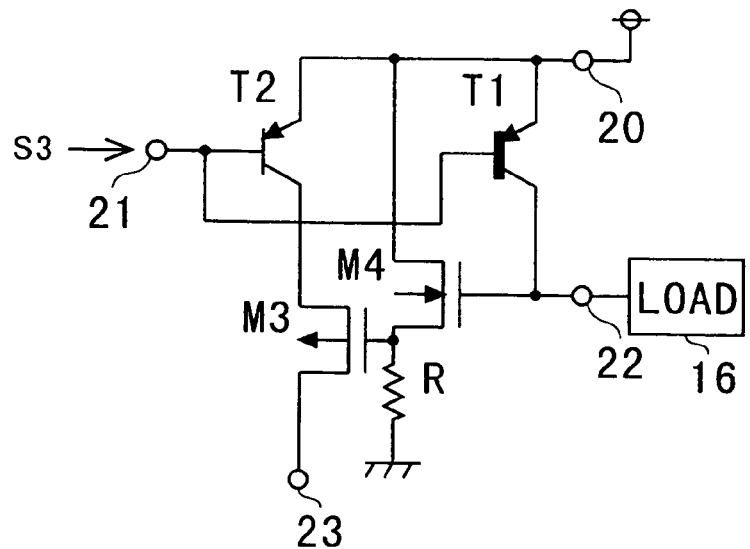

Alternatively, as shown in FIGS. 14A and 14C, a P-channel MOSFET is used as the transistor M3, which has its source connected to the drain of the transistor M2 or to the collector of the transistor T2, and an N-channel MOSFET is used as the transistor M4, which has its gate connected to the drain of the power transistor M1 or to the collector of the power transistor T1. Thus, the circuit configurations shown in FIGS. 14A and 14C have, though with the opposite polarity, the same interconnection as those shown in FIGS. 11 and 13A.

Figure 14D:
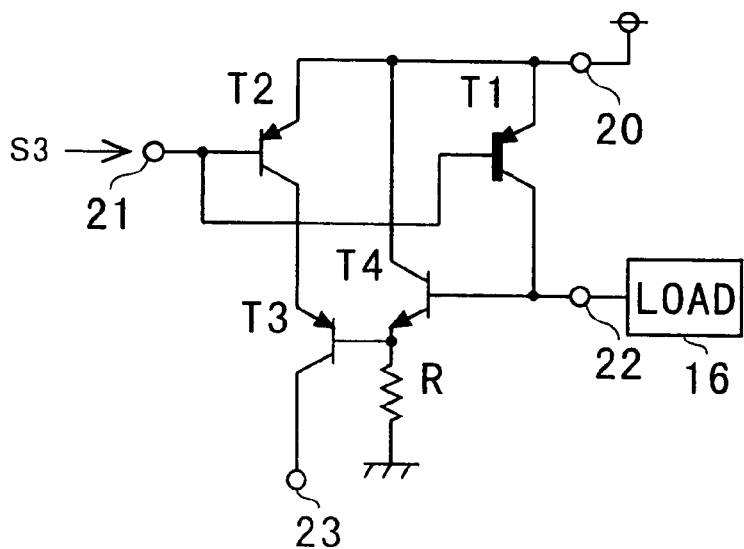

Alternatively, as shown in FIGS. 14B and 14D, a pnp-type bipolar transistor is used as the transistor T3, which has its emitter connected to the drain of the transistor M2 or to the collector of the transistor T2, and an npn-type bipolar transistor is used as the transistor T4, which has its base connected to the drain of the power transistor M1 or to the collector of the power transistor T1. Thus, the circuit configurations shown in FIGS. 14B and 14D have, though with the opposite polarity, the same interconnection as those shown in FIGS. 12 and 13B.

What is claimed is:

1. A power element protection circuit comprising:
    a voltage detector that detects, with respect to a power element having a first electrode, a second electrode, and a control electrode, a voltage between the first and second electrodes of the power element and that then outputs a current proportional to the detected voltage;
    a current detector that detects a current flowing through the power element and that then outputs a current proportional to the detected current;
    a first logarithmic converter that logarithmically converts and then outputs the current outputted from the current detector;
    a second logarithmic converter that logarithmically converts and then outputs the current outputted from the voltage detector;
    an antilogarithmic converter that antilogarithmically converts a level derived from a sum of the outputs of the first and second logarithmic converters; and
    a driving limiter that limits driving of the power element based on an output of the antilogarithmic converter.

2. A power element protection circuit as claimed in claim 1,
    wherein the first logarithmic converter is a first bipolar transistor that receives as an emitter current or collector current thereof the current outputted from the current detector and that outputs a base-emitter voltage thereof,
    wherein the second logarithmic converter is a second bipolar transistor that receives as an emitter current or collector current thereof the current outputted from the voltage detector and that outputs a base-emitter voltage thereof, and wherein the antilogarithmic converter is a third bipolar transistor that receives as a base-emitter voltage thereof the level derived from the sum of the outputs of the first and second logarithmic converters and that outputs an emitter current or collector current thereof.

3. A power element protection circuit as claimed in claim 2,
wherein the current detector comprises:
a first transistor of which a second electrode and a control electrode are connected respectively to the second electrode and the control electrode of the power element;
a second transistor of which one of a first electrode or a second electrode is connected to a first electrode of the first transistor; and
an operational amplifier
of which one input terminal is connected to the first electrode of the power element,
of which another input terminal is connected to the first electrode of the first transistor, and
of which an output terminal is connected to a control electrode of the second transistor,
wherein the second transistor outputs, at another of the first and second electrodes thereof, a current signal proportional to the current flowing through the power element.

4. A power element protection circuit as claimed in claim 3,
wherein the second transistor and the operational amplifier constitute a negative feedback circuit.

5. A power element protection circuit as claimed in claim 2,
wherein the current detector comprises:
a first transistor of which a second electrode and a control electrode are connected respectively to the second electrode and the control electrode of the power element;
a second transistor of which a second electrode is connected to a first electrode of the first transistor; and
a third transistor of which a control electrode is connected to the first electrode of the power element and of which a second electrode is connected to a control electrode of the second transistor,
wherein the second transistor outputs, at a first electrode thereof, a current signal proportional to the current flowing through the power element.

6. A power element protection circuit as claimed in claim 5,
wherein a first electrode of the third transistor is connected to the second electrodes of the power element and the first transistor, and a direct-current voltage is applied through a resistor to the second electrode of the third transistor.

7. A power element protection circuit as claimed in claim 6,
wherein the second and third transistors are transistors of opposite polarities, and a potential difference appearing between the second electrode and control electrode of the second transistor is substantially equal to a potential difference appearing between the second electrode and control electrode of the third transistor.

8. A power element protection circuit as claimed in claim 7,
wherein the second transistor is a transistor of a same polarity as the first transistor.

9. A power element protection circuit as claimed in claim 8,
wherein a first electrode of the third transistor is connected to the second electrodes of the power element and the first transistor, and a direct-current voltage is applied through a resistor to the second electrode of the third transistor.

10. A semiconductor device comprising:
a power element having a first electrode, a second electrode, and a control electrode;
a driver that feeds a drive signal to the control electrode of the power element to drive the power element; and
a power element protection circuit that is connected to the power element and to the driver so as to control the driver,
wherein the power element protection circuit comprises:
a voltage detector that detects a voltage between the first and second electrodes of the power element and that then outputs a current proportional to the detected voltage;
a current detector that detects a current flowing through the power element and that then outputs a current proportional to the detected current;
a first logarithmic converter that logarithmically converts and then outputs the current outputted from the current detector;
a second logarithmic converter that logarithmically converts and then outputs the current outputted from the voltage detector;
an antilogarithmic converter that antilogarithmically converts a level derived from a sum of the outputs of the first and second logarithmic converters; and
a driving limiter that limits driving of the power element based on an output of the antilogarithmic converter.

11. A semiconductor device as claimed in claim 10,
wherein the first logarithmic converter is a first bipolar transistor that receives as an emitter current or collector current thereof the current outputted from the current detector and that outputs a base-emitter voltage thereof,
wherein the second logarithmic converter is a second bipolar transistor that receives as an emitter current or collector current thereof the current outputted from the voltage detector and that outputs a base-emitter voltage thereof, and
wherein the antilogarithmic converter is a third bipolar transistor that receives as a base-emitter voltage thereof the level derived from the sum of the outputs of the first and second logarithmic converters and that outputs an emitter current or collector current thereof.

12. A semiconductor device as claimed in claim 11,
wherein the current detector comprises:
a first transistor of which a second electrode and a control electrode are connected respectively to the second electrode and the control electrode of the power element;
a second transistor of which one of a first electrode or a second electrode is connected to a first electrode of the first transistor; and
an operational amplifier
of which one input terminal is connected to the first electrode of the power element,
of which another input terminal is connected to the first electrode of the first transistor, and
of which an output terminal is connected to a control electrode of the second transistor,
wherein the second transistor outputs, at another of the first and second electrodes thereof, a current signal proportional to the current flowing through the power element.

13. A semiconductor device as claimed in claim 12, wherein the second transistor and the operational amplifier constitute a negative feedback circuit.

14. A semiconductor device as claimed in claim 11, wherein the current detector comprises:
a first transistor of which a second electrode and a control electrode are connected respectively to the second electrode and the control electrode of the power element;
a second transistor of which a second electrode is connected to a first electrode of the first transistor; and
a third transistor of which a control electrode is connected to the first electrode of the power element and of which a second electrode is connected to a control electrode of the second transistor,
wherein the second transistor outputs, at a first electrode thereof, a current signal proportional to the current flowing through the power element.

15. A semiconductor device as claimed in claim 14, wherein a first electrode of the third transistor is connected to the second electrodes of the power element and the first transistor, and a direct-current voltage is applied through a resistor to the second electrode of the third transistor.

16. A semiconductor device as claimed in claim 15, wherein the second and third transistors are transistors of opposite polarities, and a potential difference appearing between the second electrode and control electrode of the second transistor is substantially equal to a potential difference appearing between the second electrode and control electrode of the third transistor.

17. A semiconductor device as claimed in claim 16, wherein the second transistor is a transistor of a same polarity as the first transistor.

18. A semiconductor device as claimed in claim 17, wherein a first electrode of the third transistor is connected to the second electrodes of the power element and the first transistor, and a direct-current voltage is applied through a resistor to the second electrode of the third transistor.

* * * * *